United States Patent
Chang et al.

(10) Patent No.: US 7,262,968 B2
(45) Date of Patent: Aug. 28, 2007

(54) DEVICE FOR DECREASING THE TEMPERATURE FROM ADDRESS IC OF PLASMA DISPLAY PANEL AND THE METHOD THEREOF

(75) Inventors: Yuan-Jing Chang, Padeh (TW); Po-Kun Hsieh, Padeh (TW); Pin-Hung Chou, Padeh (TW)

(73) Assignee: Chunghwa Picture Tubes, Ltd., Padeh, Taoyuan (TW)

( * ) Notice: Subject to any disclaimer, the term of this patent is extended or adjusted under 35 U.S.C. 154(b) by 237 days.

(21) Appl. No.: 11/011,056

(22) Filed: Dec. 15, 2004

(65) Prior Publication Data

US 2006/0126300 A1    Jun. 15, 2006

(51) Int. Cl.
*H05K 7/20* (2006.01)
*G02F 1/1333* (2006.01)

(52) U.S. Cl. .............. 361/704; 361/707; 361/713; 361/714; 361/719; 349/59

(58) Field of Classification Search .............. None
See application file for complete search history.

(56) References Cited

U.S. PATENT DOCUMENTS

| | | | |
|---|---|---|---|
| 6,198,222 B1 | 3/2001 | Chang | |
| 6,288,489 B1 | 9/2001 | Isohata et al. | |
| 6,366,459 B1 * | 4/2002 | Katagiri | 361/686 |
| 6,411,353 B1 * | 6/2002 | Yarita et al. | 349/59 |
| 6,522,543 B2 * | 2/2003 | Kurihara et al. | 361/704 |
| 6,617,767 B2 | 9/2003 | Juen | |
| 6,633,126 B1 * | 10/2003 | Tsai et al. | 313/582 |
| 2003/0058230 A1 * | 3/2003 | Ide | 345/204 |
| 2005/0117304 A1 * | 6/2005 | Kim | 361/704 |

FOREIGN PATENT DOCUMENTS

| | | | |
|---|---|---|---|
| JP | 2001352022 A | * | 12/2001 |
| JP | 2002124607 A | * | 4/2002 |
| JP | 2004126151 A | * | 4/2004 |

\* cited by examiner

*Primary Examiner*—Boris Chervinsky
(74) *Attorney, Agent, or Firm*—Birch, Stewart, Kolasch & Birch, LLP

(57) ABSTRACT

A device for dissipating a heat from addressing integrated circuits (addressing ICs) of a plasma display panel that uses a back plate which has a greater surface area, to dissipate the heat from the addressing integrated circuits directly. For embodiment of the device thereof, it provides a heat-conducting sheet attached on the addressing ICs to conduct the heat from the addressing ICs to the back plate rapidly, therefore increase the efficiency of the dissipation without add the volume of the plasma display panel.

8 Claims, 3 Drawing Sheets

DEVICE FOR DECREASING THE TEMPERATURE FROM ADDRESS IC OF PLASMA DISPLAY PANEL AND THE METHOD THEREOF

BACKGROUND OF THE INVENTION

1. Field of the Invention

The present invention relates generally to a plasma display panel, in particularly to a device of increasing the efficiency of heat dissipation of the addressing ICs of the plasma display panel and the method thereof.

2. Description of the Related Art

A conventional plasma display panel (PDP) mainly has a substrate, a back plate mounted behind the substrate, a plurality of tape carrier packages (TCP) disposed at a margin of the substrate, across the back plate to connect with a printed circuit board (PCB), each of TCP is disposed with an addressing integrated circuit (addressing IC), a frame cover a margin of the panel and a back plate mounted at a back of the substrate.

While the plasma display panel works, the temperature thereof will increase and if the panel has a greater resolution, it generates greater heat. The heat is generated mainly by the addressing ICs. The addressing IC is sensitive to temperature that if the addressing IC is working in a high temperature, it will be unstable. The conventional panel is disposed with a radiator to dissipate the heat of the addressing ICs.

U.S. Pat. No. 6,198,222 discloses a heat dissipating device, which provides two fans in an inlet and an outlet of the frame to enforce the heat dissipation. This device increases the size of the panel and the cost of fabrication, so that it is not an optimal solution.

Another heat dissipating device is taught by U.S. Pat. No. 6,288, 489 and U.S. Pat. No. 6,617,767 and it uses the back plate to be the heat sink. The back plate is made of aluminum and a heat-conductive rubber sheet is disposed at between the back plate and the substrate. The heat-conductive rubber sheet has a well property of heat conduction to conduct the heat generated from the addressing ICs to the back plate. The back plate has a larger area to dissipate heat. Although the device does not use fan to force dissipating heat, it also has a good efficiency of heat dissipating.

The main drawback of the second device is that the dissipating heat of the back plate is mainly from the substrate rather than from the addressing ICs. In other words, the heat generated by the addressing ICs is conducted to the substrate, and then conducted to the back plate, it is an indirect dissipating heat function.

To overcome aforesaid drawback, a new heat dissipating device is provided. As shown in FIG. 1, the device has a substrate 20 and an aluminum frame 21 is mounted at a margin of the substrate, a plurality of addressing ICs 22 are disposed at between a TCP 23 and the frame 21, an inner heat-conducting sheet 24 is provided at between the TCP 23 and a back plate 26 to bond the TCP 23 on the back plate 26 and an outer heat-conducting sheet 25 is provided at between the addressing ICs 22 and the frame 21. As a result, the heat of the addressing ICs 22 is directly dissipated by the frame 21 via the outer heat-conducting sheet 25.

Aforesaid invention has a well heat dissipation efficiency and it takes less space. But the present plasma display panel is required for a smaller and lighter panel, the heat dissipating device still has to be improved. Such as how to increase the efficiency of heat dissipation without having to change the layout and the sizes or sharps of the substrate, the TCP and the addressing IC.

SUMMARY OF THE INVENTION

The primary objective of the present invention is to provide a device and a method to decrease the temperature of the addressing ICs.

The secondary objective of the present invention is to provide a device and a method for heat dissipation, which keep the original components' size and the cost of fabrication.

According to the objectives of the present invention, a device for decreasing the temperature form address IC of plasma display panel comprises a back plate, an outer aluminum frame is mounted at a margin of the back plate, a plurality of tape carrier packages disposed with addressing integrated circuits, and an inner heat-conducting sheet fixed on the back plate and connected to the addressing ICs, so the heat generated from the addressing ICs can be directly dissipated by the black plate via the inner heat-conducting sheet. An outer heat-conducting sheet is provided at between the TCP and the outer frame, so the heat generated from the TCP can be directly dissipated by the outer frame. The method for dissipating a heat is that uses a back plate, which has a greater surface area, to dissipate the heat of the addressing integrated circuits directly. This way can increase the efficiency of heat dissipating without increasing the size of the panel and adding other heat dissipating devices.

DETAILED DESCRIPTION OF THE INVENTION

Figure 1:
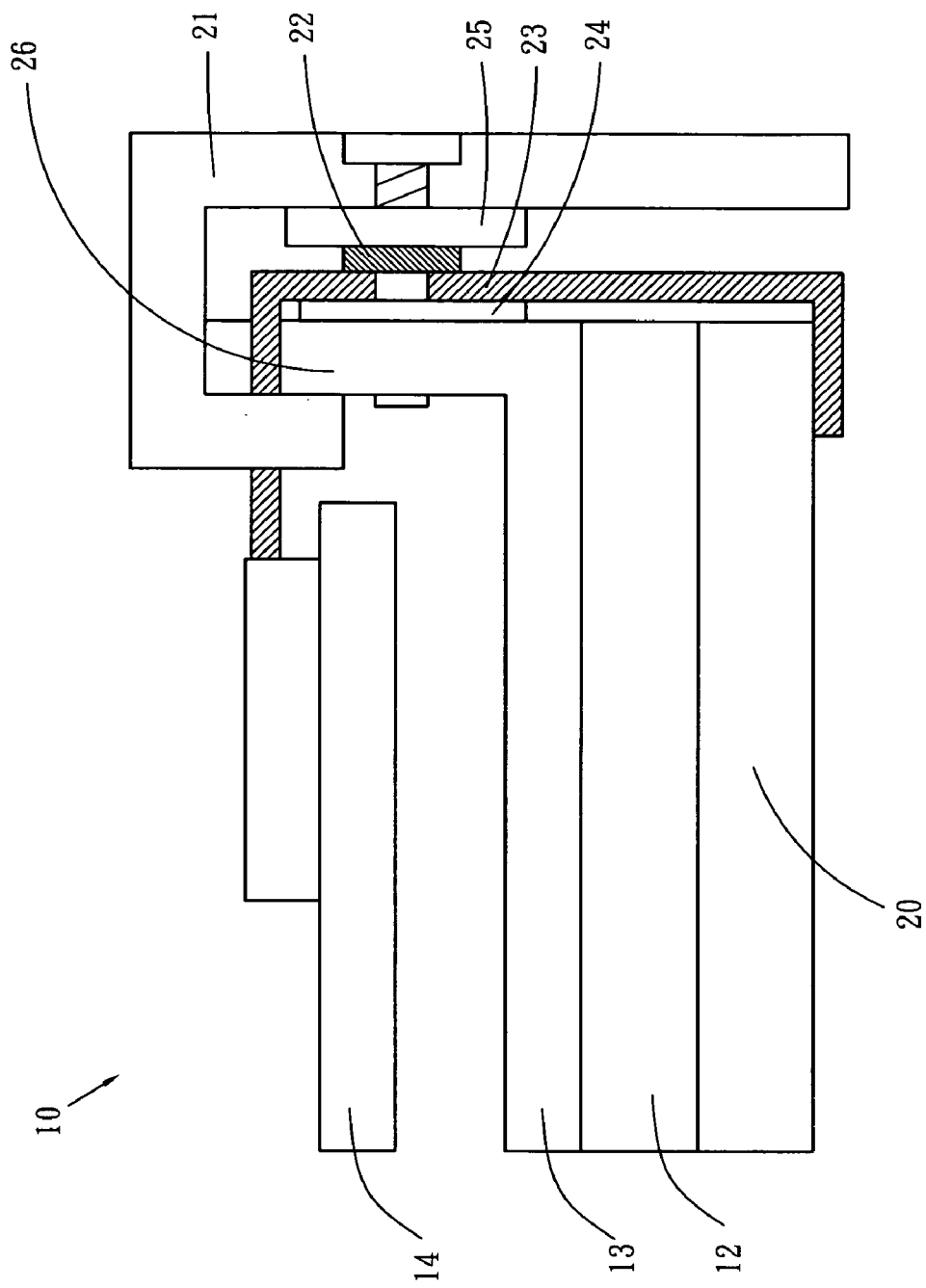
FIG. 1 is a sectional view of the frame of the conventional plasma display panel.
Figure 2:
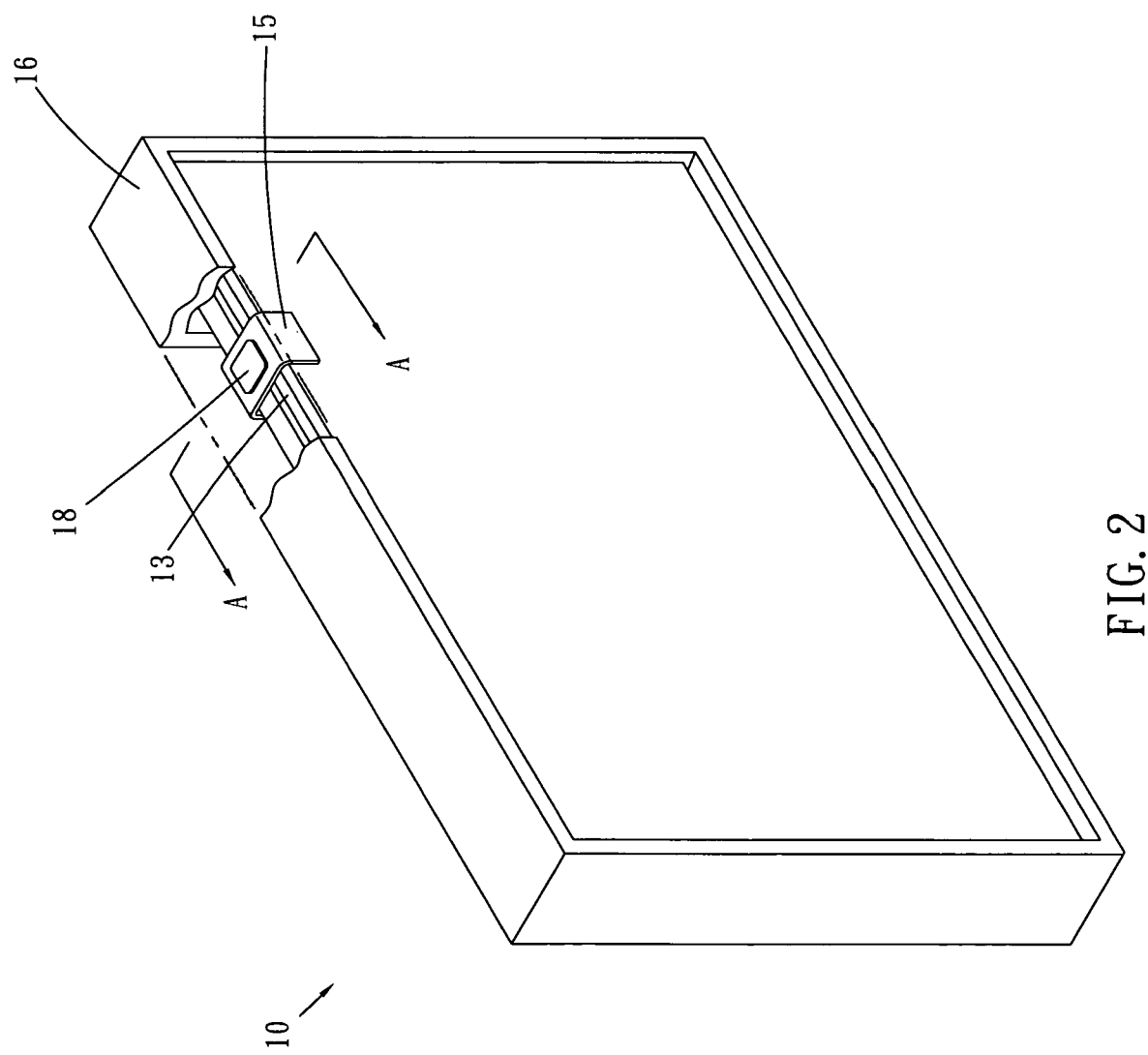
FIG. 2 is a perspective view of a preferred embodiment of the present invention.
Figure 3:
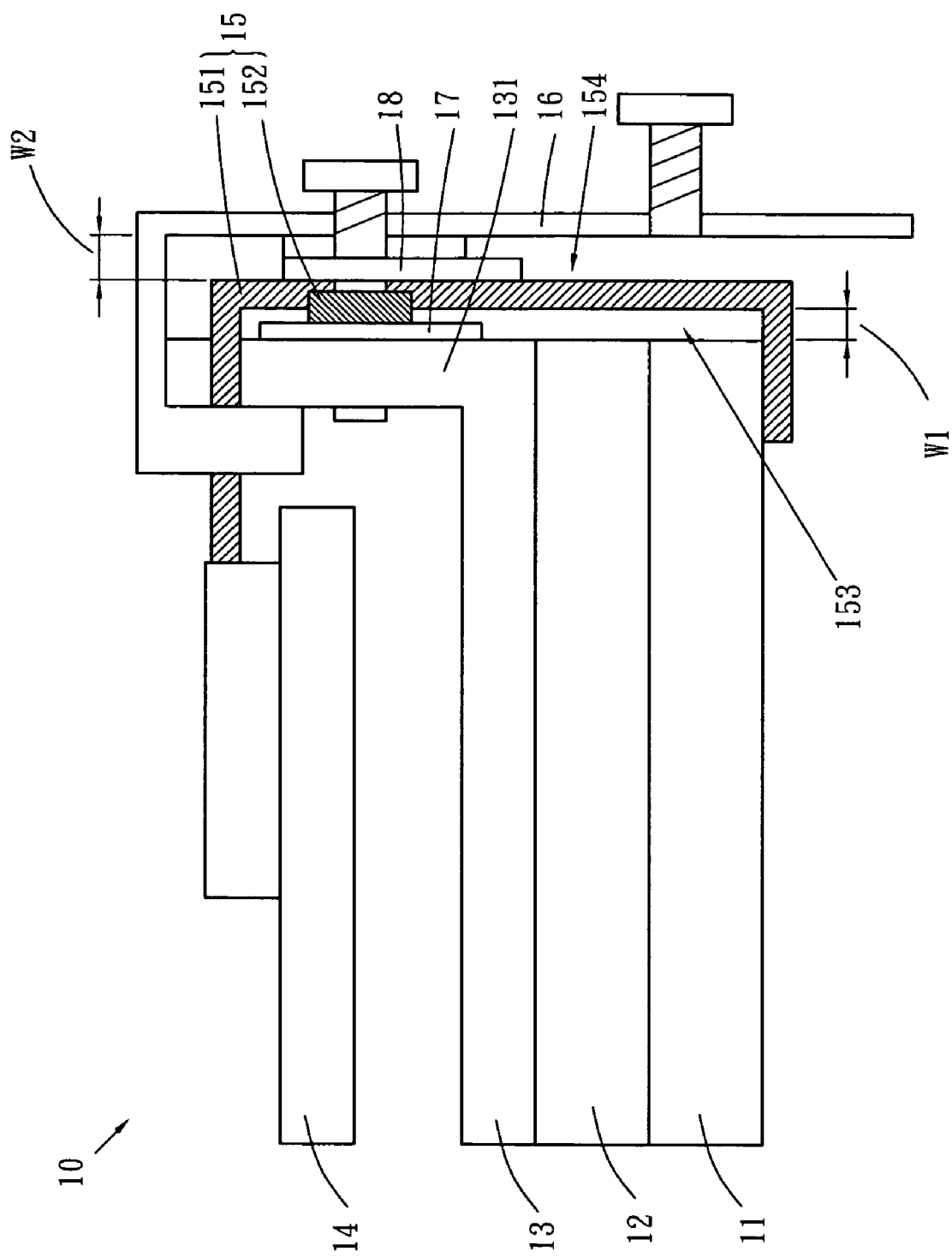
FIG. 3 is a sectional view of a preferred embodiment of the present invention referring A-A section of FIG. 2.

As shown in FIG. 2 and FIG. 3, FIG. 2 discloses a preferred embodiment of the present invention and FIG. 3 shows a sectional view of a preferred embodiment of the present invention referring A-A section of FIG. 2.

According to the present invention, a heat dissipating device is provided at a side of a plasma display plasma display panel 10. The plasma display panel 10 has a substrate 11, an adhesive tape 12 attached on a back of the substrate 11, a back plate 13 having a outstanding edge 131 attached on a back of the adhesive tape 12, a printed circuit board (PCB) 14 arranged at a rear side of the plasma display panel 10, a tape carrier package (TCP) 15 mounted at between the substrate 11 and the PCB 14, which has a main member 151 connected to a lateral side of the substrate 11 and a addressing IC 152 bonded to the main member 151, a outer frame 16 mounted to the TCP 15, an inner heat-conducting sheet 17 between the TCP 15 and the outstanding edge 131 of the back plate 13, and an outer heat-conducting sheet 18 between the TCP 15 and the frame 16. The inner and outer heat-conducting sheet 17 and 18 are superior in heat conduction.

The main heat dissipating method of the present invention is that directly conducts the heat of the addressing IC 152 to the back plate 13 via the inner heat-conducting sheet 17.

The structure's of the present invention has three features: First, that the addressing IC 152 is disposed attaching the main member 151 with its outer end, and inner end projected from the main member 151 and toward the outstanding edge 131 of the back plate 13. The inner end of addressing IC 152 also touches the surface of the inner heat-conducting sheet 17. Second, a first gap 153 defined between the main member 151 and outstanding edge 131 having a width W1 that amount to height of project portion of the addressing IC 152 plus thickness of the inner heat-conducting sheet 17. Third, a second gap 154 defined between the main member 151 and frame 16 having a width W2 larger than thickness of the outer heat-conducting sheet 18.

As a result, the heat generated by the addressing IC 152 is conducted quickly to the outstanding edge 131 of the back plate 13 via inner heat-conducting sheet 17 while the plasma display panel 10 is working. Because the surface area of the back plate 13 is greater than the surface area of the frame 16, so that back plate 13 has a greater efficiency of heat dissipation.

Because of the addressing IC 152 projected from the main member 151, the first gap 153 at an interior side of the TCP 15 increases the width W1, such that the first gap 153 provides a sufficient space for convention and that has a great help for the heat dissipation.

In addition, the addressing IC 152 has a portion embedded in the main member 151 of the TCP 15 and the widths W1 and W2 of the first and the second gaps 153 and 154 can be adjusted that provides the plasma display plasma display panel 10 has a smaller size.

The present invention has been described via detailed illustration of some embodiments. Those skilled in the art can derive variations from the embodiments without departing from the scope of the present invention. For example, positions adjust from upper and lower side to right and left side of the plasma display plasma display panel 10. Therefore, the embodiments shall not limit the scope of the present invention defined in the claims.

What is claimed is:

1. A device for dissipating heat-generated by integrated circuits of a plasma display panel having a substrate, comprising:
    an adhesive tape attached on a back of said substrate, and
    a back plate having an outstanding edge attached on a back of said adhesive tape;
    a plurality of tape carrier packages each of which has an integrated circuit and a main member connected to a lateral side of said substrate, said integrated circuit bonded to said main member, and said tape carrier package mounted between said substrate and a printed circuit board (PCB);
    an inner heat-conducting sheet attached on said outstanding edge and connected to said integrated circuit to directly conduct said heat of said integrated circuit to said back plate; and
    wherein said integrated circuit is disposed on said main member with an outer end of said integrated circuit, and an inner end of said integrated circuit protruded out from said main member and toward said outstanding edge of said back plate, said inner end of said integrated circuit also touched a surface of said inner heat-conducting sheet.

2. The device as claimed in claim 1, further comprising an outer frame surrounding said back plate, an outer heat-conducting sheet connected said outer frame and said tape carried packages to conduct said heat of said integrated circuit to said outer frame.

3. The device as claimed in claim 2, further comprising a space between said outstanding edge and said outer frame for convection.

4. The device as claimed in claim 1, further comprising a first gap between said main member and outstanding edge having a width W1 that amount to a height of said integrated circuit protruded in the width W1 plus a thickness of said inner heat-conducting sheet, and a second gap between said main member and an outer frame having a width W2 larger than thickness of the outer heat-conducting sheet, said widths W1 and W2 of the first and the second gaps can be adjusted so that said plasma display panel can reduce its size and gain space for said beat dissipation.

5. A method for dissipating heat generated by integrated circuits of a plasma display panel having a substrate, comprising:
    providing an adhesive tape attached on a back of said substrate;
    providing a back plate having an outstanding edge attached on a back of said adhesive tape;
    providing a plurality of tape carrier packages each of which has an integrated circuit and a main member connected to a lateral side of said substrate, said integrated circuit bonded to said main member, and said tape carrier package mounted between said substrate and a printed circuit board (PCB); and
    providing at least a heat-conducting sheet which is connected to said back plate and a plurality of integrated circuits of said tape carrier package;
    wherein said integrated circuit is disposed on said main member with an outer end of said integrated circuit, and an inner end of said integrated circuit protruded out from said main member and toward said outstanding edge of said back plate, said inner end of said integrated circuit also touched a surface of said inner heat-conducting sheet.

6. The method as claimed in claim 5, further comprising providing an outer frame surrounding said back plate.

7. A method for dissipating heat generated by integrated circuits of a plasma display panel, comprising providing a substrate, a back plate behind said substrate, a plurality of tape carrier packages connected to said substrate and said back plate, each of said tape carrier packages have an integrated circuit and a main member, and an inner heat-conducting sheet attached on an outstanding edge of said back plate and said integrated circuit, which conducts the heat of said integrated circuit to said back plate.

8. The device as claimed in claim 5, further comprising a first gap between said main member and outstanding edge having a width W1 that amount to a height of said integrated circuit protruded in the width W1 plus a thickness of said inner heat-conducting sheet, and a second gap between said main member and an outer frame having a width W2 larger than thickness of the outer heat-conducting sheet, said widths W1 and W2 of the first and the second gaps can be adjusted so that said plasma display panel can reduce its size and gain space for said heat dissipation.

* * * * *